(12) United States Patent
Fukazawa et al.

(10) Patent No.: US 10,186,421 B2
(45) Date of Patent: Jan. 22, 2019

(54) COMPOSITE SEMICONDUCTOR SUBSTRATE

(71) Applicant: AIR WATER INC., Chuo-ku, Sapporo-shi, Hokkaido (JP)

(72) Inventors: Akira Fukazawa, Nagano (JP); Mitsuhisa Narukawa, Nagano (JP); Keisuke Kawamura, Nagano (JP)

(73) Assignee: AIR WATER INC. (JP)

( * ) Notice: Subject to any disclaimer, the term of this patent is extended or adjusted under 35 U.S.C. 154(b) by 0 days.

(21) Appl. No.: 15/556,531

(22) PCT Filed: Jan. 14, 2016

(86) PCT No.: PCT/JP2016/050987
§ 371 (c)(1),
(2) Date: Sep. 7, 2017

(87) PCT Pub. No.: WO2016/143381
PCT Pub. Date: Sep. 15, 2016

(65) Prior Publication Data
US 2018/0053647 A1   Feb. 22, 2018

(30) Foreign Application Priority Data
Mar. 9, 2015 (JP) ................................ 2015-046375

(51) Int. Cl.
*H01L 29/778* (2006.01)
*H01L 21/02* (2006.01)
(Continued)

(52) U.S. Cl.
CPC ...... *H01L 21/0254* (2013.01); *H01L 21/0262* (2013.01); *H01L 21/02381* (2013.01);
(Continued)

(58) Field of Classification Search
CPC ............. H01L 21/0254; H01L 29/7786; H01L 21/0262; H01L 29/267; H01L 21/02529;
(Continued)

(56) References Cited

U.S. PATENT DOCUMENTS 9,245,736 B2 * 1/2016 Ziad ................. H01L 21/02598
9,276,066 B2 * 3/2016 Tamura ............... H01L 29/7786
(Continued)

FOREIGN PATENT DOCUMENTS

JP    11-162848 A    6/1999
JP    2006-216671 A    8/2006
(Continued)

OTHER PUBLICATIONS

International Preliminary Report on Patentability and Written Opinion, dated Sep. 12, 2017 in PCT/JP2016/050987.
(Continued)

*Primary Examiner* — Jarrett J Stark
(74) *Attorney, Agent, or Firm* — Wood, Phillips, Katz, Clark & Mortimer

(57) ABSTRACT

A composite semiconductor substrate being able to improve voltage withstanding and crystalline quality is provided. A composite semiconductor substrate is equipped with an Si (silicon) substrate, an SiC (silicon carbide) layer formed on the surface of the Si substrate, an AlN (aluminum nitride) layer formed on the surface of the SiC layer, a composite layer formed on the surface of the AlN layer, and a GaN (gallium nitride) layer formed on the surface of the composite layer. The composite layer includes an AlN (aluminum nitride) layer and a GaN layer formed on the surface of the AlN layer. In at least one composite layer, the average density of C and Fe in the GaN layer is higher than the average density of C and Fe in the AlN layer.

12 Claims, 6 Drawing Sheets

(51) Int. Cl.
*H01L 21/20* (2006.01)
*H01L 21/205* (2006.01)
*H01L 29/812* (2006.01)
*H01L 29/267* (2006.01)
*H01L 29/45* (2006.01)
*H01L 29/47* (2006.01)

(52) U.S. Cl.
CPC ........ *H01L 21/02529* (2013.01); *H01L 21/20* (2013.01); *H01L 21/205* (2013.01); *H01L 29/267* (2013.01); *H01L 29/778* (2013.01); *H01L 29/7786* (2013.01); *H01L 29/812* (2013.01); *H01L 29/452* (2013.01); *H01L 29/475* (2013.01)

(58) Field of Classification Search
CPC . H01L 21/02381; H01L 21/20; H01L 29/812; H01L 29/778; H01L 21/205; H01L 29/452; H01L 29/475
See application file for complete search history.

(56) References Cited

U.S. PATENT DOCUMENTS

| | | | | |
|---|---|---|---|---|
| 9,748,344 | B2* | 8/2017 | Omori | ................. H01L 21/0243 |
| 9,923,061 | B2* | 3/2018 | Bavard | ............. H01L 21/02381 |
| 10,068,858 | B2* | 9/2018 | Abe | ...................... C30B 25/183 |
| 2006/0170003 | A1 | 8/2006 | Saito et al. | |
| 2010/0123169 | A1 | 5/2010 | Sato | |
| 2010/0244098 | A1 | 9/2010 | Yokoyama | |
| 2013/0069208 | A1 | 3/2013 | Briere | |
| 2013/0328106 | A1 | 12/2013 | Kokawa et al. | |
| 2014/0091318 | A1* | 4/2014 | Ishiguro | ............ H01L 29/42372 257/76 |
| 2014/0339605 | A1 | 11/2014 | Briere | |

FOREIGN PATENT DOCUMENTS

| | | |
|---|---|---|
| JP | 2008-171843 A | 7/2008 |
| JP | 2010-232297 A | 10/2010 |
| JP | 2011-082494 A | 4/2011 |
| JP | 2012-243868 A | 12/2012 |
| JP | 2013-069714 A | 4/2013 |
| JP | 2013-070053 A | 4/2013 |
| JP | 2010-123725 A | 6/2013 |
| JP | 2013-179121 A | 9/2013 |
| JP | 2014-049674 A | 3/2014 |
| JP | 2014-072429 A | 4/2014 |

OTHER PUBLICATIONS

International Search Report, dated Apr. 19, 2016, in International Patent Application No. PCT/2016/050987.
Office Action dated May 15, 2018 in Japanese Patent Application No. 2015-046375.
Office Action dated Aug. 31, 2018 in Japanese Patent Application No. 2015-046375.
Supplementary European Search Report, dated Oct. 18, 2018, in European Patent Application No. EP 16 76 1353.

* cited by examiner

COMPOSITE SEMICONDUCTOR SUBSTRATE

FIELD OF THE INVENTION

This invention relates to a composite semiconductor substrate. More specifically, this invention relates to a composite semiconductor substrate including a SiC (silicon carbide) layer.

BACKGROUND OF THE INVENTION

SiC has a wide band gap when compared to Si (silicon), and has high insulated breakdown field strength. Therefore, SiC is expected to serve as material of high-voltage semiconductor devices. Since the lattice constant of 3C-SiC (SiC which has a 3C type crystal structure) is similar to the lattice constant of GaN (gallium nitride), 3C-SiC can be used as a buffer layer for growing GaN. When 3C-SiC is used as a buffer layer for growing GaN, higher-voltage semiconductor devices of GaN can be obtained, since GaN and 3C-SiC have high insulated breakdown field strength.

As foundation substrates for growing SiC layers, Si substrates or bulk SiC substrates are widely used. Since there are only about 4 inch SiC substrates at present, it is difficult to increase the diameter. To obtain an inexpensive and large diameter SiC layer, it is preferable that an Si substrate is used as the foundation substrate.

The below Document 1 discloses a method for manufacturing a semiconductor substrate having a first step and a second step, wherein a film of $Al_xIn_yGa_{1-x-y}N$ layer ($0<x\le1$, $0\le y\le1$, $x+y\le1$) is formed on a film of a SiC layer formed on a Si substrate at a temperature higher than a GaN film forming temperature, and a film of GaN is formed at the GaN film forming temperature in the first step, and a film of an $Al_xIn_yGa_{1-x-y}N$ layer ($0<x\le1$, $0\le y\le1$, $x+y\le1$) is formed at a temperature lower than the GaN film forming temperature, and a film of GaN is formed at the GaN film forming temperature in the second step.

The below Documents 2 to 4 disclose methods for doping a nitride semiconductor layer with C (carbon) or the like, to improve tolerance of a semiconductor device including a nitride semiconductor layer. More specifically, the below Document 2 discloses a composite semiconductor substrate in which a multilayer buffer layer and nitride active layer are deposited in series on a Si single-crystal substrate, wherein $Al_xGa_{1-x}N$ single-crystal layers ($0.6\le x\le1.0$) including C at $1*10^{18}$ to $1*10^{21}$ atoms/cm³ and $Al_yGa_{1-y}N$ single-crystal layers ($0.1\le y\le 0.5$) including C at $1*10^{17}$ to $1*10^{21}$ atoms/cm³ are alternately and repeatedly deposited in this order in the multilayer buffer layer, and the nitride active layer consists of an electron transition layer in which the C containing density is equal to or less than $5*10^{17}$ atoms/cm³ and an electron supply layer. The C containing densities in the $Al_xGa_{1-x}N$ single-crystal layer and the $Al_yGa_{1-y}N$ single-crystal layer decrease from the substrate side toward the active layer side.

The below Document 3 discloses a nitride semiconductor wafer including a substrate and a buffer layer on the substrate, wherein the buffer layer includes an alternating layer of $Al_xGa_{1-x}N$ layer ($0\le x\le 0.05$) and $Al_yGa_{1-y}N$ layer ($0<y\le1$, and $x<y$). In the alternating layer, only the $Al_yGa_{1-y}N$ layer includes acceptors.

Further, the below Document 4 discloses a nitride semiconductor element which includes a base substrate, a buffer layer formed above the base substrate, an active layer formed on the buffer layer, and at least 2 electrodes formed above the active layer. The buffer layer has one or more composite layers which include a plurality of nitride semiconductor layers having different lattice constants. In at least one of the composite layers, a carrier area of the nitride semiconductor layer having the largest lattice constant among the plurality of nitride semiconductor layers is intentionally doped with carbon atoms at a density beforehand determined and oxygen atoms at a density beforehand determined.

PRIOR ART DOCUMENT(S)

Document(s) Related to Patent(s)

[Document 1] Japan Patent Publication No. 2013-179121
[Document 2] Japan Patent Publication No. 2011-82494
[Document 3] Japan Patent Publication No. 2014-49674
[Document 4] Japan Patent Publication No. 2013-69714

OVERVIEW OF THE INVENTION

Problem(S) to be Resolved by the Invention

When producing a semiconductor device using GaN, and an Si substrate is used as a start substrate (foundation substrate), warpage of the substrate and cracks in the GaN layer are likely to occur, since differences of the lattice constants and the thermal expansion coefficients between GaN and Si are large. The lattice constants and thermal expansion coefficients of GaN and Si are relaxed, by using an SiC layer and an $Al_xIn_yGa_{1-x-y}N$ layer as buffer layers such as a technique disclosed in the Document 1, so that warpage of the substrate and cracks in the GaN layer are suppressed. On the other hand, the technique of the Document 1 has a problem in which the voltage withstanding is poor.

When the nitride semiconductor layer is doped with C or the like to improve tolerance, according to the techniques of Documents 2 to 4, there arises a problem in which the crystalline quality of the nitride semiconductor layer is degraded by the C used for the doping.

This invention is to solve the above problems. The object is to provide composite semiconductor substrates which can improve the voltage withstanding and the crystalline quality.

The Way to Solve the Problem(s)

According to one aspect of this invention, a composite semiconductor substrate comprises: an Si substrate or an SOI (Silicon On Insulator) substrate, an SiC layer formed on a surface of the substrate, an $Al_aIn_bGa_{1-a-b}N$ layer ($0<a\le1$, $0\le b<1$, $0\le 1-a-b<1$, $a>b$, $a>1-a-b$) formed on a surface of the SiC layer, a composite layer formed on a surface of the $Al_aIn_bGa_{1-a-b}N$ layer, and an $Al_cIn_dGa_{1-c-d}N$ layer ($0\le c\le 0.3$, $0\le d\le 0.4$, $c<a$, $1-a-b<1-c-d$) formed on a surface of the composite layer, wherein the composite layer includes an $Al_vIn_wGa_{1-v-w}N$ layer ($0\le v\le 0.3$, $0\le w\le 0.4$, $v<a$, $1-a-b<1-v-w$) and $Al_xIn_yGa_{1-x-y}N$ layer ($v<x\le1$, $0\le y<1$, $0\le 1-x-y<1$, $1-x-y<1-v-w$, $c<x$, $1-x-y<1-c-d$, $x>y$, $x>1-x-y$) formed on a surface of the $Al_vIn_wGa_{1-v-w}N$ layer, and an average density of C and Fe in the $Al_vIn_wGa_{1-v-w}N$ layer is higher than an average density of C and Fe in the $Al_xIn_yGa_{1-x-y}N$ layer in at least one the composite layer.

Preferably, as for the composite semiconductor substrate, number of the composite layers is more than or equal to 1 and equal to or less than 9.

Preferably, as for the composite semiconductor substrate, the number of the composite layers is plural, and the $Al_vIn_wGa_{1-v-w}N$ layer in at least one of the plurality of the composite layers includes C.

Preferably, as for the composite semiconductor substrate, average densities of C and Fe in the $Al_vIn_wGa_{1-v-w}N$ layers in the plurality of composite layers decrease from the $Al_vIn_wGa_{1-v-w}N$ layer nearest the SiC layer toward the $Al_vIn_wGa_{1-v-w}N$ layer farthest from the SiC layer.

Preferably, as for the composite semiconductor substrate, the number of the composite layers is more than or equal to 3 and equal to or less than 6.

Preferably, as for the composite semiconductor substrate, a compositional ratio of each of Al, In, and Ga of one $Al_vIn_wGa_{1-v-w}N$ layer in the plurality of composite layers and a compositional ratio of each of Al, In, and Ga of another $Al_vIn_wGa_{1-v-w}N$ layer in the plurality of composite layers are different from each other, and a compositional ratio of each of Al, In, and Ga of one $Al_xIn_yGa_{1-x-y}N$ layer in the plurality of composite layers and a compositional ratio of each of Al, In, and Ga of another $Al_xIn_yGa_{1-x-y}N$ layer in the plurality of composite layers are different from each other.

Preferably, as for the composite semiconductor substrate, an average density of C and Fe in the $Al_vIn_wGa_{1-v-w}N$ layer of at least one of the composite layers is more than or equal to $1*10^{18}$ atoms/cm$^3$ and equal to or less than $1*10^{20}$ atoms/cm$^3$.

Preferably, as for the composite semiconductor substrate, the average density of C and Fe in the $Al_vIn_wGa_{1-v-w}N$ layer of at least one of the composite layers is more than or equal to $3*10^{18}$ atoms/cm$^3$ and equal to or less than $1*10^{19}$ atoms/cm$^3$.

Preferably, as for the composite semiconductor substrate, a density of C and Fe in an inner part of the $Al_vIn_wGa_{1-v-w}N$ layer in at least one of the composite layers changes from a side close to the SiC layer toward a side away from the SiC layer.

Preferably, as for the composite semiconductor substrate, the $Al_vIn_wGa_{1-v-w}N$ layer in at least one of the composite layers includes a first layer, a second layer formed on a surface of the first layer, and a third layer formed on a surface of the second layer, and an average density of C and Fe in the second layer is higher than an average density of C and Fe in the first layer and an average density of C and Fe in the third layer.

Preferably, as for the composite semiconductor substrate, the $Al_vIn_wGa_{1-v-w}N$ layer is an $Al_vGa_{1-v}N$ layer ($0 \leq v \leq 0.3$, $v<a$, $1-a-b<1-v$), and the $Al_xIn_yGa_{1-x-y}N$ layer is an $Al_xGa_{1-x}N$ layer ($v<x \leq 1$, $0<x \leq 1$, $1-x<1-v$, $c<x$, $1-x<1-c-d$, $x>1-x$).

Preferably, as for the composite semiconductor substrate, the $Al_vIn_wGa_{1-v-w}N$ layer is a GaN layer, the $Al_xIn_yGa_{1-x-y}N$ layer is an AlN layer.

Preferably, the composite semiconductor substrate further comprises a first and a second electrodes formed at the surface side of the $Al_cIn_dGa_{1-c-d}N$ layer, wherein magnitude of electrical current which flows between the first electrode and the second electrode depends on electrical voltage between the first electrode and the second electrode.

The Effect of the Invention

According to this invention, composite semiconductor substrates being able to improve the voltage withstanding and the crystalline quality can be provided.

DESCRIPTION OF THE PREFERRED EMBODIMENTS

The embodiments of this invention will be explained in the followings based on the Figures. In the following explanations, a "surface" of each of layers which constitute a composite semiconductor substrate is a term to represent an upper side face in Figures, and a "reverse face" is a term to represent a lower side face in Figures. The term of a "surface side" encompasses a location making contact with the "surface" and an upper location in Figures being separated from the "surface". The term of a "reverse face side" encompasses a location making contact with the "reverse face" and a lower location in Figures being separated from the "reverse face".

[The First Embodiment]

Figure 1:
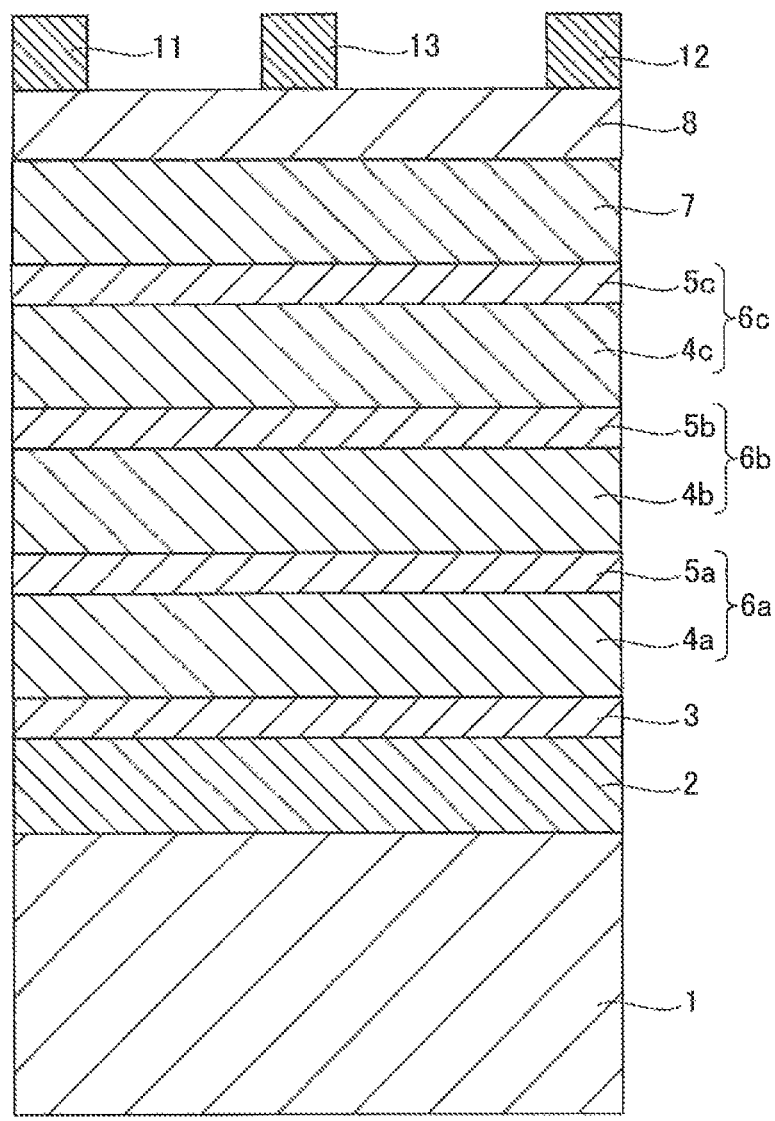
FIG. 1 shows a cross section view of a structure of a composite semiconductor substrate, according to the first embodiment of this invention.

FIG. 1 shows a cross section view of a structure of a composite semiconductor substrate, according to the first embodiment of this invention.

Referring to FIG. 1, a composite semiconductor substrate according to this embodiment includes a HEMT (High Electron Mobility Transistor). The composite semiconductor substrate is equipped with Si substrate 1, SiC layer 2, AlN layer 3, composite layers 6a, 6b and 6c, GaN layer 7, AlGaN layer 8, source electrode 11 and drain electrode 12 (examples of the first and the second electrodes), and gate electrode 13.

Si substrate 1 comprises of undoped Si. The (111) plane is exposed on the surface of Si substrate 1. Si substrate 1 may have p-type or n-type conductivity. The (100) plane or the (110) plane may be exposed on the surface of Si substrate 1.

SiC layer 2 is formed on the surface of Si substrate 1. SiC layer 2 comprises of 3C-SiC, 4H-SiC, 6H-SiC, or the like. In particular, when SiC layer 2 was made by epitaxial growth on the surface of Si substrate 1, SiC layer 2 typically comprises of 3C-SiC.

SiC layer 2 may be formed by homoepitaxial growth of SiC, by using the MBE (Molecular Beam Epitaxy) method, the CVD (Chemical Vapor Deposition) method, the LPE (Liquid Phase Epitaxy) method, or the like, on the foundation layer which comprises of SiC obtained by carbonizing of the surface of Si substrate 1. SiC layer 2 may be formed only by carbonizing of the surface of Si substrate 1. Further, SiC layer 2 may be formed by heteroepitaxial growth on the surface of Si substrate 1 (a buffer layer may be interposed).

SiC layer 2 may be changed to an n-type or a p-type. As impurity (dopant) for making SiC layer 2 the p-type, at least one of B (boron), Al (aluminium), Ga (gallium), and In (indium) can be used, for example. As impurity for making SiC layer 2 the n-type, at least one of N (nitrogen), P (phosphorus), and As (arsenic) can be used, for example. To control carrier density of the p-type and the n-type, transition elements such as V (vanadium) may be used for doping.

AlN layer 3 is formed on the surface of SiC layer 2. AlN layer 3 acts as a buffer layer to alleviate difference between the lattice constant of SiC layer 2 and the lattice constant of GaN layer 4. AlN layer 3 is formed by using the MOCVD (Metal Organic Chemical Vapor Deposition) method, for example. The growth temperature of AlN layer 3 is more than or equal to 1100 degree Celsius and equal to or less than 1300 degree Celsius, for example. At this time, as Al source gas, TMA (Tri Methyl Aluminium), TEA (Tri Ethyl Aluminium), or the like is used, for example. As N source gas, $NH_3$ (ammonia) is used, for example. The thickness of AlN layer 3 is preferably more than or equal to 10 nm and equal to or less than 500 nm.

AlN layer 3 may be an $Al_aIn_bGa_{1-a-b}N$ layer ($0<a\leq1$, $0\leq b<1$, $0\leq 1-a-b<1$, $a>b$, $a>1-a-b$) by replacing part of Al atoms with at least one of In atoms and Ga atoms (However, the compositional ratio of In should not exceed the compositional ratio of Al). AlN layer 3 may be an $Al_aGa_{1-a}N$ layer ($0<a\leq1$, $a>1-a$), by replacing part of Al atoms with Ga atoms. To maintain the crystalline quality of GaN layer 4, the $Al_aIn_bG_{a1-a-b}N$ layer is preferably an AlN layer (It is better not to replace Al atoms with In atoms and Ga atoms).

Composite layers 6a, 6b and 6c are formed on the surface of SiC layer 2, in this order. Each of composite layers 6a, 6b and 6c includes a GaN layer and an AlN layer. GaN layer 4a of composite layer 6a is formed on the surface of AlN layer 3. AlN layer 5a of composite layer 6a is formed on the surface of GaN layer 4a. GaN layer 4b of composite layer 6b is formed on the surface of AlN layer 5a. AlN layer 5b of composite layer 6b is formed on the surface of GaN layer 4b. GaN layer 4c of composite layer 6c is formed on the surface of AlN layer 5b. AlN layer 5c of composite layer 6c is formed on the surface of GaN layer 4c.

In the following explanations, any one of GaN layers 4a, 4b and 4c may be referred to as GaN layer 4. Any one of AlN layers 5a, 5b and 5c may be referred to as AlN layer 5. Any of composite layers 6a, 6b and 6c may be referred to as composite layer 6. The composite semiconductor substrate should have at least one composite layer 6. The composite semiconductor substrate preferably has more than or equal to 1 and equal to or less than 9 composite layers. The composite semiconductor substrate more preferably has a plurality of composite layers (more than or equal to 2 and equal to or less than 9 layers). The composite semiconductor substrate furthermore preferably has more than or equal to 3 and equal to or less than 6 composite layers.

The thickness of GaN layer 4 is preferably more than or equal to 50 nm and equal to or less than 5 μm. Herewith, inhibiting warpage of the substrate, a high quality GaN layer can be obtained.

GaN layer 4a is formed by using the MOCVD method, for example, in the following manner. Firstly, three-dimensional nuclei of GaN crystal are formed at predetermined density. Next, the three-dimensional nuclei of GaN crystal are grown in the horizontal direction at a temperature lower than the growth temperature of AlN layer 5 to form a continuous GaN single-crystal film. At this time, as Ga source gas, TMG (Tri Methyl Gallium), TEG (Tri Ethyl Gallium), or the like is used, for example. As N source gas, NH3 is used, for example.

Further, each of GaN layers 4b and 4c (the GaN layer other than GaN layer 4a) is formed by using the MOCVD method, for example, in the following manner. A continuous GaN single-crystal film is formed by two dimensions nucleus growth (coherent growth), at a temperature lower than the growth temperature of AlN layer 5. At this time, as Ga source gas, TMG, TEG, or the like is used, for example. As N source gas, $NH_3$ is used, for example.

The process temperature in the step for forming the three-dimensional nucleus, the step for growing three-dimensional nucleus of GaN crystals in the horizontal direction, and the step for the two dimensions nucleus growth (the growth temperature of GaN layer 4) is higher than the growth temperature of AlN layer 5. The growth temperature of GaN layer 4 is more than or equal to 900 degree Celsius and equal to or less than 1200 degree Celsius, for example.

GaN layer 4 may be an $Al_vIn_wGa_{1-v-w}N$ layer ($0\leq v\leq 0.3$, $0\leq w\leq 0.4$, $v<a$, $1-a-b<1-v-w$), by replacing part of Ga atoms with at least one of Al atoms and In atoms. GaN layer 4 may be $Al_vGa_{1-v}N$ layer ($0\leq v\leq 0.3$, $v<a$, $1-a-b<1-v$) by replacing part of Ga atoms with Al atoms. However, to maintain crystalline quality of GaN layer 4, an $Al_vIn_wGa_{1-v-w}N$ layer is preferably a GaN layer (It is better not to replace Ga atoms with Al atoms and In atoms).

AlN layer 5 fulfills the function for suppressing the occurrence of warpage. When AlN layer 5 is sandwiched by two GaN layers 4, AlN layer 5 fulfills the function for alleviating stress between the two GaN layers 4. AlN layer 5 is formed by using the MOCVD method, for example. The growth temperature of AlN layer 5 is lower than the growth temperature of AlN layer 3, and is more than or equal to 800 degree Celsius and equal to or less than 1200 degree Celsius, for example. At this time, as Al source gas, TMA, TEA, or the like is used, for example. As N source gas, $NH_3$ is used, for example. The thickness of AlN layer 5 is preferably more than or equal to 10 nm and equal to or less than 500 nm. Herewith, dislocation formed in AlN layer 5 is reduced, and the crystalline quality of GaN layer 4 can be improved. In addition, the time required for forming AlN layer 5 can be shorten.

AlN layer 5 may be an $Al_xIn_yGa_{1-x-y}N$ layer ($v<x\leq 1$, $0\leq y<1$, $0\leq 1-x-y<1$, $1-x-y<1-v-w$, $c<x$, $1-x-y<1-c-d$, $x>y$, $x>1-x-y$), by replacing part of Al atoms with at least one of In atoms and Ga atoms (However, the compositional ratio of In should not exceed the compositional ratio of Al). AN layer 5 may be an $Al_xGa_{1-x}N$ layer ($v<x\leq 1$, $0<x\leq 1$, $1-x<1-v$, $c<x$, $1-x<1-c-d$), by replacing part of Al atoms with Ga atoms. However, to maintain the crystalline quality of GaN layer 4, an $Al_xIn_yGa_{1-x-y}N$ layer is preferably an AlN layer (It is better not to replace Al atoms with In atoms and Ga atoms).

When GaN layer 4 is an $Al_vIn_wGa_{1-v-w}N$ layer, and AlN layer 5 is an $Al_xIn_yGa_{1-x-y}N$ layer, the compositional ratio of Al in the $Al_xIn_yGa_{1-x-y}N$ layer is higher than the compositional ratio of Al in the $Al_vIn_wGa_{1-v-w}N$ layer (namely, $v<x$), and the compositional ratio of Ga in the $Al_xIn_yGa_{1-x-y}N$ layer is lower than the compositional ratio of Ga in the $Al_xIn_wGa_{1-v-w}N$ layer (namely, $1-x-y<1-v-w$).

The lattice constant of AlN and the lattice constant of GaN are very close, and the lattice constant of AlN is smaller than the lattice constant of GaN. When the AlN layer was formed on the GaN layer as a foundation, the AlN layer does not take over the crystal structure of the foundation GaN layer. Slip occurs at the interface between the AlN layer and the GaN layer. On the other hand, when a GaN layer is formed on an AlN layer as a foundation, the GaN layer grows coherently with respect to the foundation AlN layer, and compression stress occurs in the GaN layer, being subject to the influence of the lattice constant of the AlN layer. In consequence, the occurrence of cracks in the GaN layer and warpage are suppressed. In addition, the quality of the crystals of GaN layer 4 and AlN layer 5 can be improved, by forming AlN layer 3, GaN layer 4, and AlN layer 5 on the surface of SiC layer 2, under the above mentioned growth condition.

In at least one of composite layers 6, the average density of C and Fe in GaN layer 4 is higher than the average density of C and Fe in AlN layer 5.

In at least one of composite layers 6, the average density of C and Fe in GaN layer 4 is preferably more than or equal to $1*10^{18}$ atoms/cm$^3$, is more preferably more than or equal to $3*10^{18}$ atoms/cm$^3$, and is furthermore preferably more than or equal to $5*10^{18}$ atoms/cm$^3$. Herewith, the resistor of GaN layer 4 can be increased greatly, so that the voltage withstanding can be improved. On the other hand, in at least one of composite layers 6, the average density of C and Fe in GaN layer 4 is preferably equal to or less than $1*10^{20}$ atoms/cm$^3$, is more preferably equal to or less than $1*10^{19}$ atoms/cm$^3$. Herewith, crystalline quality degradation of GaN layer 4 can be suppressed. GaN layer 4 in at least one of composite layers 6 preferably includes C.

The average density of C and Fe means the average value of the density distribution of the sum total of C and Fe in the normal direction (the depth direction) of the surface of Si substrate 1 in the layers. The density distribution of C and Fe in the normal direction of the surface of Si substrate 1 in the layers can be measured by using SIMS (Secondary Ion Mass Spectrometry).

GaN layer 4 is doped with C in the following manner, for example. When forming GaN layer 4 doped with C in a positive manner by using the MOCVD method, the film forming temperature and the formed film pressure different from the case in which a film of a GaN layer not being doped with C in a positive manner are adopted. Then, GaN layer 4 is doped with C included in Ga organic metal. GaN layer 4 may be doped with C, by introducing organic gas into the chamber in which the MOCVD is performed. C ions may be injected into GaN layer 4.

GaN layer 4 is doped with Fe, in the following manner, for example. When GaN layer 4 is formed by using the MOCVD method, GaN layer 4 is doped with Fe, by introducing Fe organic metal into the chamber in which the MOCVD is performed. Fe ions may be injected into GaN layer 4.

Since O (oxygen) has a harmful effect on the crystalline quality of the GaN layer, it is preferable that GaN layer 4 does not include O.

GaN layer 7 is formed on the surface of composite layer 6c. Impurity was not introduced to GaN layer 7, and GaN layer 7 acts as an electron transition layer of the HEMT. GaN layer 7 is formed in a manner similar to GaN layer 5.

AlGaN layer 8 is formed on the surface of GaN layer 7. AlGaN layer 8 has n-type conductivity, and is a barrier layer of the HEMT. AlGaN layer 8 is formed by the MOCVD method or the like, for example.

Source electrode 11, drain electrode 12, and gate electrode 13 are formed on the surface of AlGaN layer 8, being spaced apart from each other. Source electrode 11 and drain electrode 12 are placed in ohmic contact with AlGaN layer 8. Gate electrode 13 is placed in schottky contact with Al GaN layer 8. Source electrode 11 and drain electrode 12 have a structure in which a Ti (titanium) layer and an Al (aluminium) layer are laminated in the order from the side of AlGaN layer 8, for example. The gate electrode 13 has a structure in which an Ni (nickel) layer and an Au (gold) layer are laminated in the order from the side of AlGaN layer 8, for example. Source electrode 11, drain electrode 12, and gate electrode 13 are formed by a deposition method, a MOCVD method, a sputtering method, or the like, for example.

The HEMT according to the embodiment works, as follows. Due to the band gap difference between GaN layer 7 and AlGaN layer 8, electrons occurred in AlGaN layer 8 gather at the heterojunction interface of GaN layer 7 and Al GaN layer 8, and form the two dimensions electron gas. In line with the forming the two dimensions electron gas, AlGaN layer 8 completely becomes a depletion layer by the depletion layer extending upwardly from the heterojunction interface with GaN layer 7 in FIG. 1 and the depletion layer extending downwardly from the joint interface with gate electrode 13 in FIG. 1.

When positive electrical voltage is applied to gate electrode 13 and drain electrode 12, in a state in which source electrode 11 is kept at the ground potential, the two dimensions electron gas density increases by the electrical field effect, so that electrical current flows from drain electrode 12 to source electrode 11.

According to the composite semiconductor substrate of this embodiment, since AlN layer 3 is formed on the surface of SiC layer 2, and GaN layer 4 is formed on the surface of AlN layer 3, the quality of the GaN layer 4 crystal can be improved. Since the average density of C and Fe in GaN layer 4 is high, in at least one of composite layers 6, the electrical resistance of the GaN layer 4 increases, and the voltage withstanding of the composite semiconductor substrate can be improved. Further, since the average density of C and Fe in AlN layer 5 is low, in at least one of composite layers 6, the quality of the GaN layer 4 crystal formed on the surface can be improved. More specifically, if the average density of C and Fe in AlN layer 5 is high, smoothness of the surface of AlN layer 5 degrades, and compression force does not act on GaN layer 4 formed on the surface of AlN layer 5. In consequence, cracks and warpage are likely to occur in GaN layer 4 formed on the surface of AlN layer 5. The occurrence of cracks and warpage in GaN layer 4 results in deterioration of quality in layers formed at the surface side of the GaN layer 4. To maintain smoothness on the surface of AlN layer 5, it is necessary to decrease the average density of C and Fe in AlN layer 5, if at all possible.

Since electrical resistance of an AlN layer is high when compared to a GaN layer, even though an AlN layer is doped with C or Fe in a positive manner, the effect of improving voltage withstanding is small. Therefore, it is better not to dope AlN layer 3 with C or Fe in a positive manner.

Next, examples of the density distribution of C and Fe in the composite layer will be explained.

Figure 2:
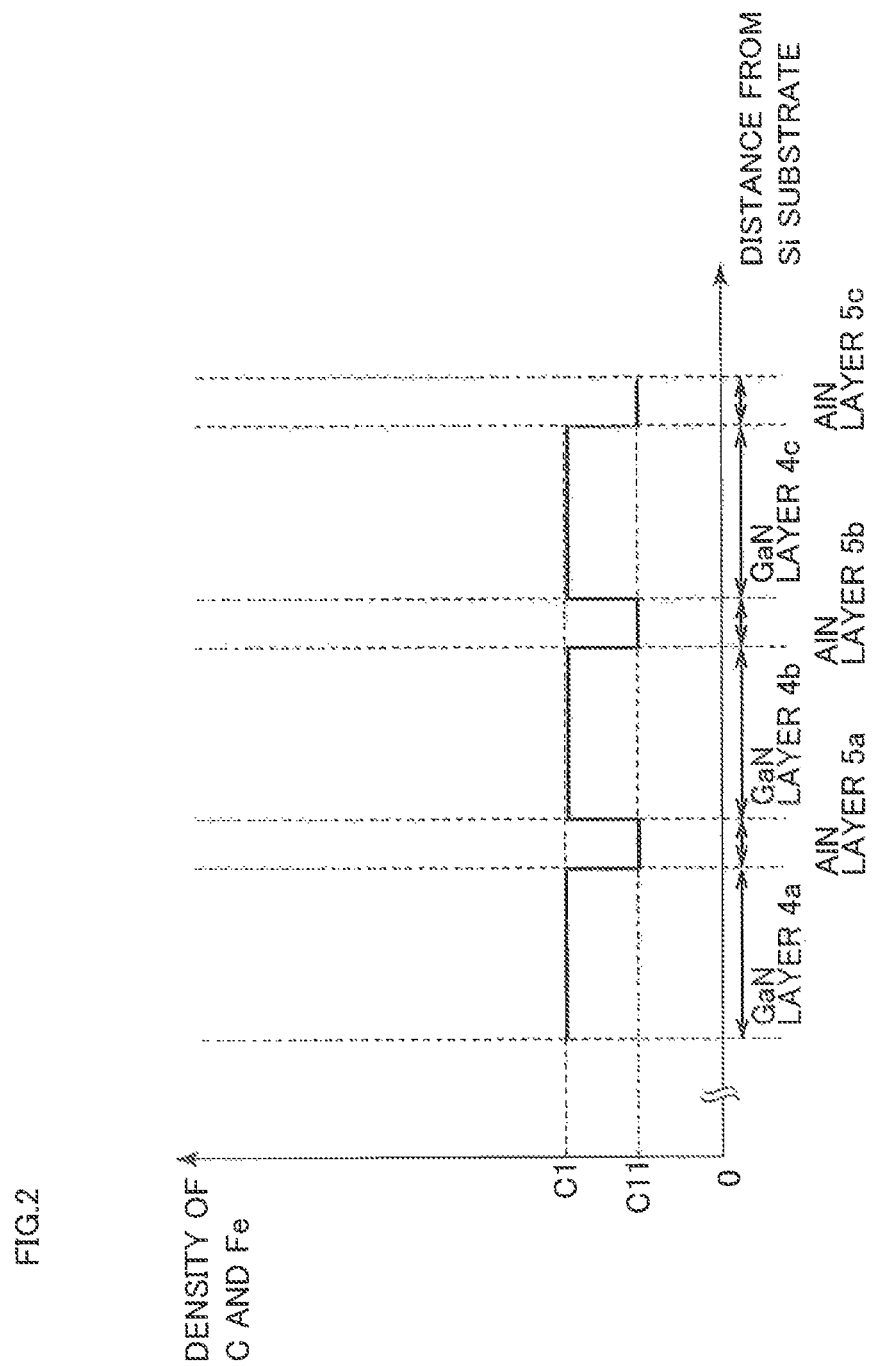
FIG. 2 shows a graph indicating the first example of relationship between the distance from the Si substrate surface and the density of C and Fe in the composite layer, according to the composite semiconductor substrate of the first embodiment of this invention.

FIG. 2 shows a graph indicating the first example of relationship between the distance from the Si substrate surface and the density of C and Fe in the composite layer, according to the composite semiconductor substrate of the first embodiment of this invention.

Referring to FIG. 2, according to this example, in all the composite layers 6a, 6b and 6c, the average density of C and Fe in each of GaN layers 4a, 4b and 4c is higher than the average density of C and Fe in each of AlN layers 5a, 5b and 5c. The density of C and Fe in the inner part of each of GaN layers 4a, 4b and 4c is a constant value (density C1), regardless of the distance from the surface of Si substrate 1. The average densities of C and Fe in GaN layers 4a, 4b and 4c are all density C1. The density of C and Fe in each of AlN layers 5a, 5b and 5c is a constant value (density C11), regardless of the distance from the surface of Si substrate 1. The average densities of C and Fe in AlN layers 5a, 5b and 5c are all density C11 (<C1).

According to this example, a composite layer in which the density distribution of C and Fe is uniform, can be formed.

Figure 3:
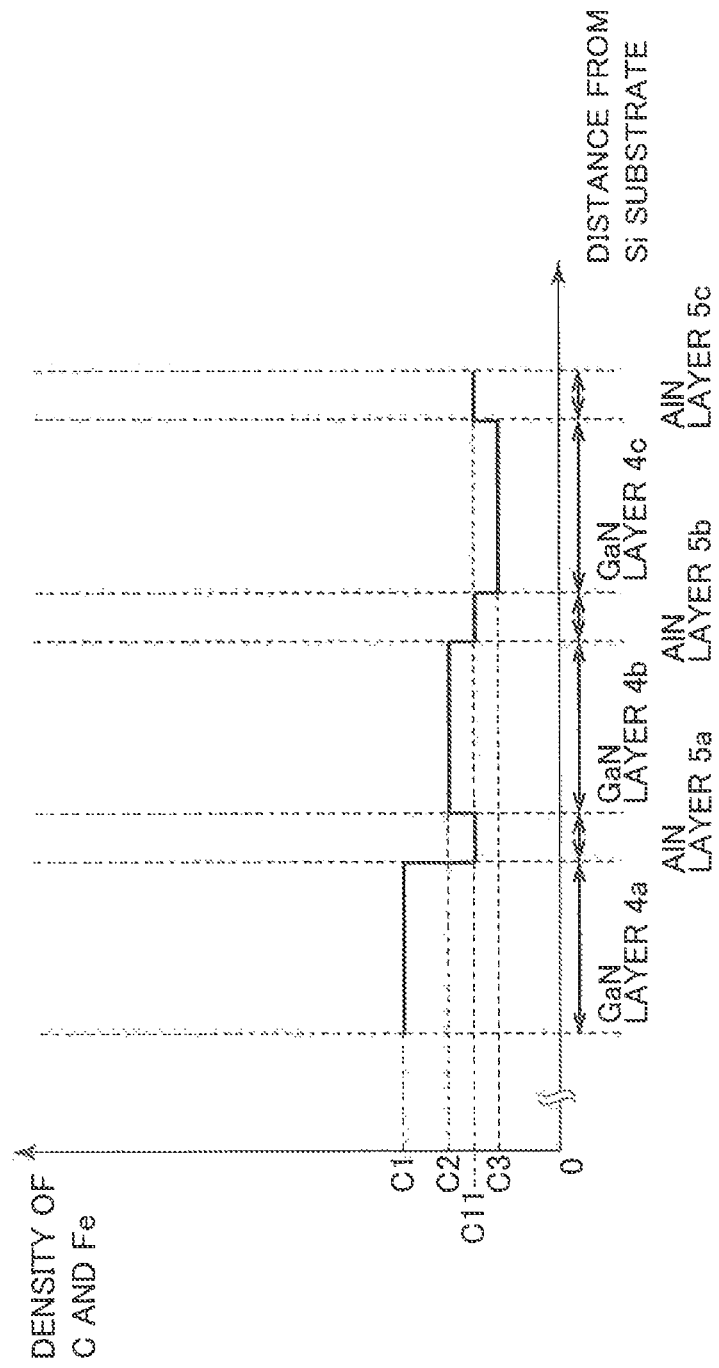
FIG. 3 shows a graph indicating the second example of relationship between the distance from the Si substrate surface and the density of C and Fe in the composite layer, according to the composite semiconductor substrate of the first embodiment of this invention.

FIG. 3 shows a graph indicating the second example of relationship between the distance from the Si substrate surface and the density of C and Fe in the composite layer, according to the composite semiconductor substrate of the first embodiment of this invention.

Referring to FIG. 3, according to this example, in each of composite layers 6a and 6b, the average density of C and Fe in each of GaN layers 4a and 4b is higher than the average density of C and Fe in each of AlN layers 5a and 5b. On the other hand, in composite layer 6c, the average density of C and Fe in GaN layer 4c is lower than the average density of C and Fe in AlN layer 5c. The density of C and Fe in the inner part of each of GaN layers 4a, 4b and 4c is a constant value, regardless of the distance from the surface of Si substrate 1. The density of C and Fe in each of AlN layers 5a, 5b and 5c is a constant value (density C11), regardless of the distance from the surface of Si substrate 1. The average densities of C and Fe in AlN layers 5a, 5b and 5c are all density C11 (C3<C11<C2).

The average density of C and Fe in each of GaN layers 4a, 4b and 4c decreases from GaN layer 4a nearest from SiC layer 2 toward GaN layer 4c farthest from SiC layer 2. More specifically, the average density of C and Fe in GaN layer 4a is density C1. The average density of C and Fe in GaN layer 4b is density C2 (<C1). The average density of C and Fe in GaN layer 4c is density C3 (<C2).

According to this example, GaN layer 4 (mainly, GaN layer 4a) close to SiC layer 2 plays a role of improving the voltage withstanding, and GaN layer 4 (mainly, GaN layer 4c) away from SiC layer 2 play a role of improving the crystalline quality of GaN layer 4. In consequence, both the voltage withstanding and the crystalline quality can be improved in an effective manner.

The average densities of C and Fe in AlN layers 5a, 5b and 5c may decrease from AlN layer 5a nearest from SiC layer 2 toward AlN layer 5c farthest from SiC layer 2.

Figure 4:
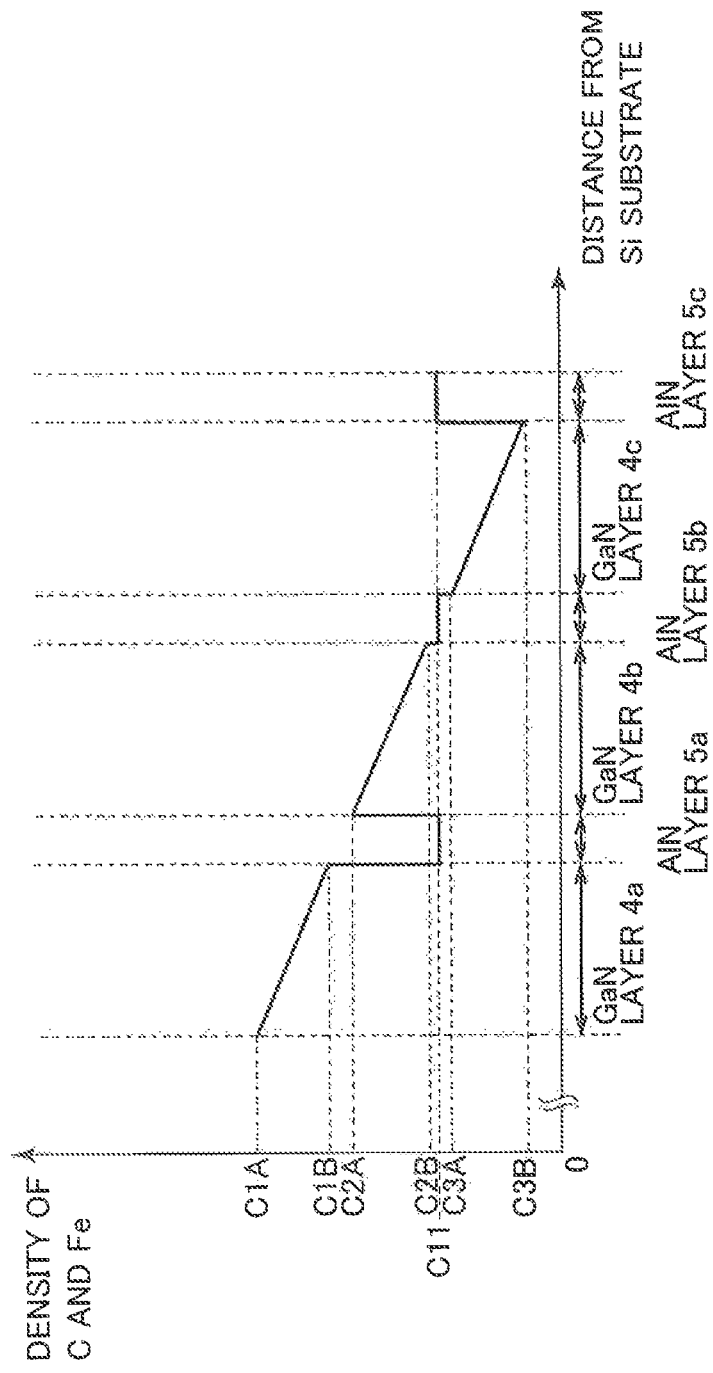
FIG. 4 shows a graph indicating the third example of relationship between the distance from the Si substrate surface and the density of C and Fe in the composite layer, according to the composite semiconductor substrate of the first embodiment of this invention.

FIG. 4 shows a graph indicating the third example of relationship between the distance from the Si substrate surface and the density of C and Fe in the composite layer, according to the composite semiconductor substrate of the first embodiment of this invention.

Referring to FIG. 4, according to this example, the density of C and Fe in the inner part of each of GaN layers 4a, 4b and 4c changes from the reverse side (the side close to Si substrate 1) toward the surface side (the side away from Si substrate 1). More specifically, the density of C and Fe in GaN layer 4a decreases from the reverse side to the surface side, from density C1A to density C1B (<C1<C1A). The density of C and Fe in GaN layer 4b decreases from the reverse side to the surface side, from density C2A to density C2B (<C2<C2A). The density of C and Fe in GaN layer 4c decreases from the reverse side to the surface side, from density C3A to density C3B (<C3<C3A).

The average densities of C and Fe of GaN layers 4a, 4b and 4c decrease from GaN layer 4a nearest from SiC layer 2 toward GaN layer 4d farthest from SiC layer 2. More specifically, the average density of C and Fe in GaN layer 4a is density C1. The average density of C and Fe in GaN layer 4b is density C2 (<C1). The average density of C and Fe in GaN layer 4c is density C3 (<C2). The densities of C and Fe of AlN layers 5a, 5b and 5c are a constant value (density C11), regardless of the distance from the surface of Si substrate 1. The average densities of C and Fe in AlN layers 5a, 5b and 5c are all density C11 (C3<C11<C2).

According to this example, the effect similar to the second example can be obtained, and the density distribution of C and Fe in the inner part of GaN layer 4 can fluctuate.

The density of C and Fe in the inner part of each of AlN layers 5a, 5b and 5c may be changed from the reverse side (the side closed to Si substrate 1) to the surface side (the side away from Si substrate 1).

Figure 5:
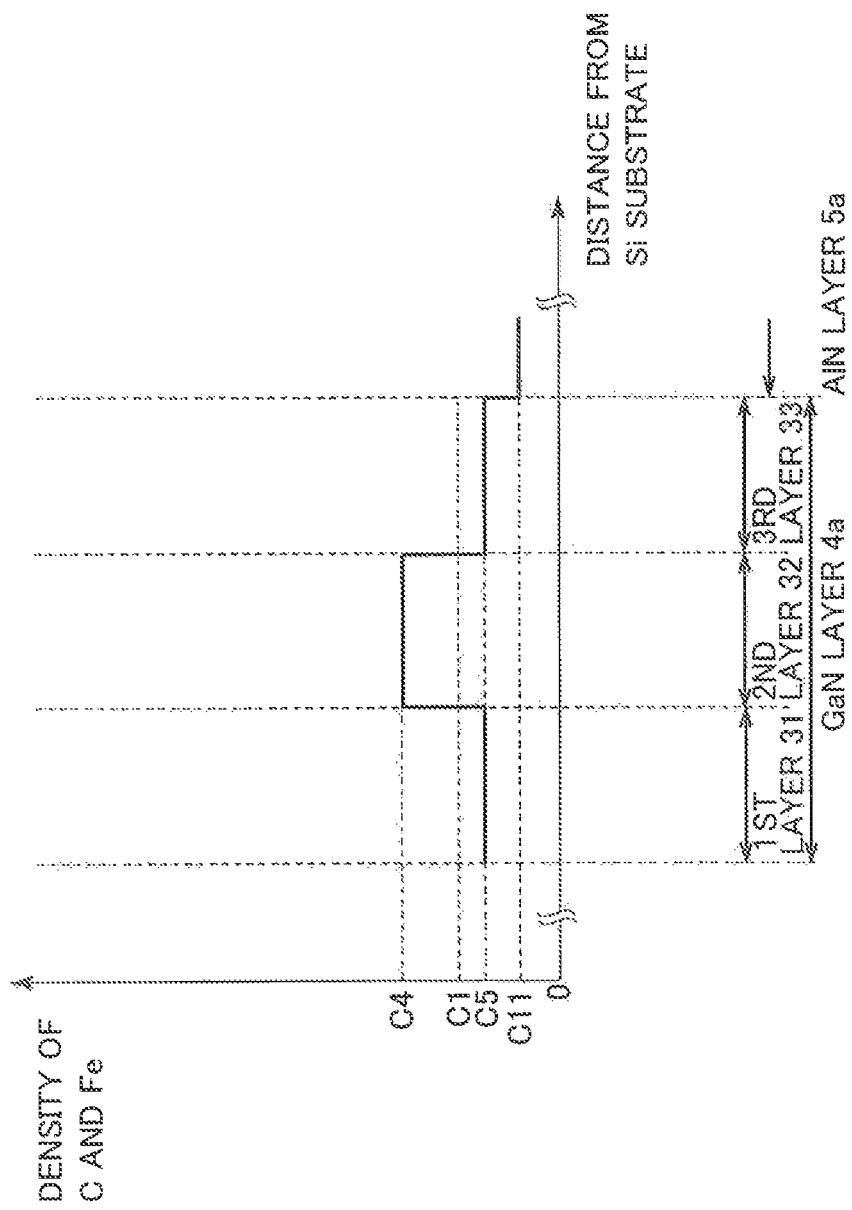
FIG. 5 shows a graph indicating the fourth example of relationship between the distance from the Si substrate surface and the density of C and Fe in the composite layer, according to the composite semiconductor substrate of the first embodiment of this invention.

FIG. 5 shows a graph indicating the fourth example of relationship between the distance from the Si substrate surface and the density of C and Fe in the composite layer, according to the composite semiconductor substrate of the first embodiment of this invention. In FIG. 5, only the density distribution of C and Fe in GaN layer 4a is selectively indicated.

Referring to FIG. 5, according to this example, GaN layer 4a consists of a plurality of layers of which the densities of C and Fe are different from each other. GaN layer 4a includes the first layer 31, the second layer 32, and the third layer 33. The second layer 32 is formed on the surface of the first layer 31. The third layer 33 is formed on the surface of the second layer 32. The density of C and Fe in the inner part of each of the first layer 31, the second layer 32, and the third layer 33 is a constant value, regardless of the distance from the surface of Si substrate 1. The average density of C and Fe in the second layer 32 is density C4. The average density of C and Fe in each of the first layer 31 and the third layer 33 is density C5 (<C4). The average density of C and Fe in GaN layer 4a is C1 (C5<C1<C4, C11<C1).

According to this example, the second layer 32 plays a role of improving the voltage withstanding, and each of the first layer 31 and the third layer plays a role of smoothing the boundary face with AlN layers 3 and 5a. In consequence, both the voltage withstanding and the crystalline quality can be improved in an effective manner, and the occurrence of warpage and cracks can be suppressed in an effective manner.

In this example, each of GaN layer 4b and 4c may have the density distribution of C and Fe similar to the density distribution of C and Fe of the inner part of GaN layer 4a, and may have the density distribution of C and Fe different from the density distribution of C and Fe of the inner part of GaN layer 4a. AlN layer 5 may be formed by a plurality of layers of which the densities of C and Fe are different from each other, as similar to GaN layer 4a.

[The Second Embodiment]

Figure 6:
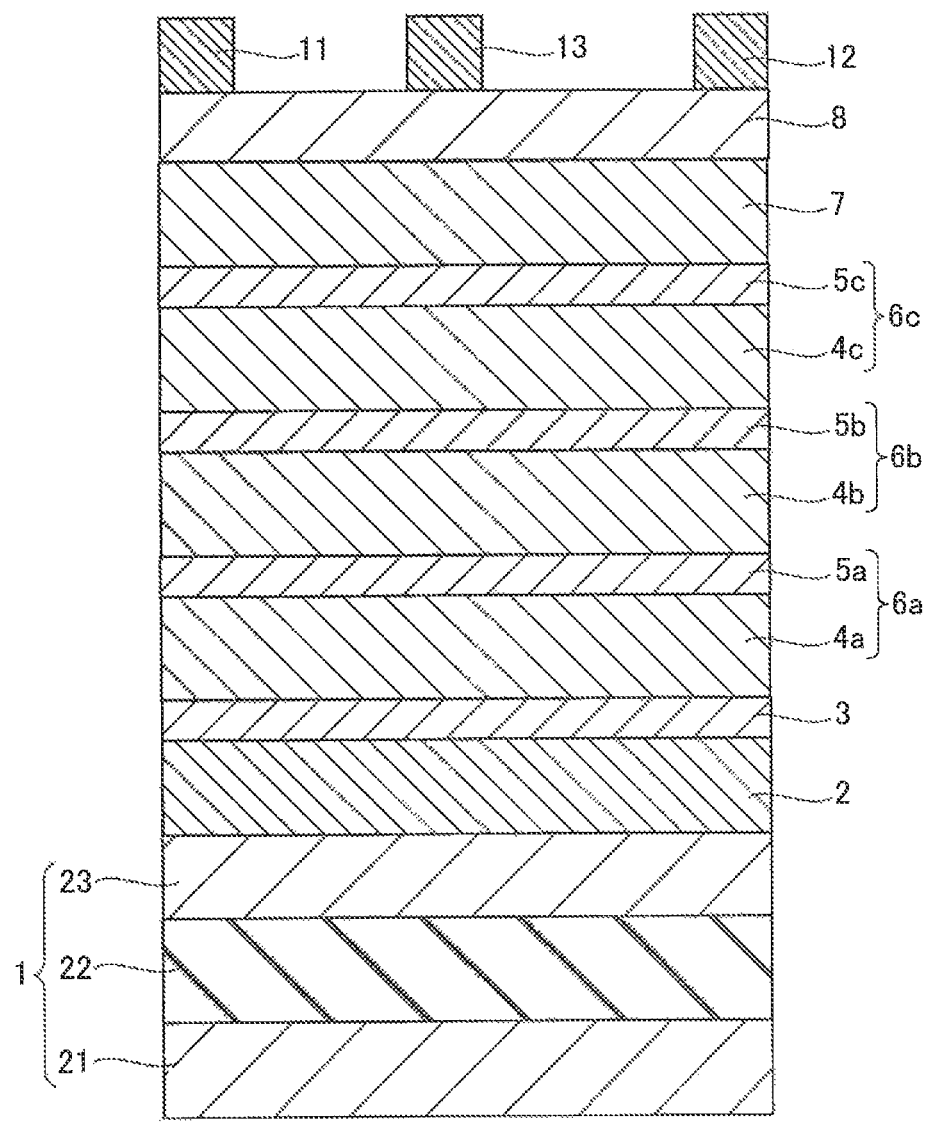
FIG. 6 shows a cross section view of a structure of a composite semiconductor substrate, according to the second embodiment of this invention.

FIG. 6 shows a cross section view of a structure of a composite semiconductor substrate, according to the second embodiment of this invention.

Referring to FIG. 6, the composite semiconductor substrate according to the embodiment is different from the composite semiconductor substrate of the first embodiment, in the sense that it is equipped with SOI substrate 1 as substitute for a Si substrate. An SOI substrate is a substrate of a single-crystal Si, formed on an insulating film. SOI substrate 1 includes Si substrate 21, $SiO_2$ (silicon dioxide) layer 22, and SOI layer 23. On the surface of Si substrate 21, $SiO_2$ layer 22 is formed. On the surface of $SiO_2$ layer 22, SOI layer 23 consist of Si is formed. SOI substrate 1 is made by an arbitrary method.

Since the structures of the composite semiconductor substrate according to the embodiment other than the above mentioned and the density distribution of C and Fe in the composite layers and so on are similar to the composite semiconductor substrate according to the first embodiment, the same numerals are provided for same components, and the explanations are not repeated.

According to this embodiment, by adopting SOI substrate 1 as a foundation of SiC layer 2, the junction capacitance of the composite semiconductor substrate can be smaller, and the voltage withstanding can be improved.

[Others]

When a composite semiconductor substrate has a plurality of composite layers 6, and a layer corresponds to GaN layer 4 in each of the plurality of composite layers 6 consists of an $Al_vIn_wGa_{1-v-w}N$ layer ($0 \leq v \leq 0.3$, $0 \leq w \leq 0.4$, $v<a$, $1-a-b<1-v-w$), the compositional ratio of each of Al, In, and Ga in one $Al_vIn_wGa_{1-v-w}N$ layer in the plurality of composite layer 6 and the compositional ratio of each of Al, In, and Ga in another $Al_vIn_wGa_{1-v-w}N$ layer in the plurality of composite layer 6 may be different with each other. When a layer corresponds to AlN layer 5 in each of a plurality of composite layer 6 consists of an $Al_xIn_yGa_{1-x-y}N$ layer ($v<x \leq 1$, $0 \leq y<1$, $0<x+y \leq 1$, $1-x-y<1-v-w$, $c<x$, $1-x-y<1-c-d$), the compositional ratio of each of Al, In, and Ga in one $Al_xIn_yGa_{1-x-y}N$ layer in the plurality of composite layer 6 and the compositional ratio of each of Al, In, and Ga in another $Al_xIn_yGa_{1-x-y}N$ layer in the plurality of composite layer 6 may be different with each other.

A device formed on the composite semiconductor substrate is an arbitrary device, and it may be a transistor, an LED (Light Emitting Diode), a thyristor, a semiconductor laser, or the like, other than the above mentioned device. The composite semiconductor substrate may be a substrate in which the magnitude of the electrical current flows between the first electrode and the second electrode formed at the surface side of the $Al_xIn_yGa_{1-x-y}N$ layer depends on the electrical voltage between the first electrode and the second electrode.

Although the present invention has been described and illustrated in detail, it is clearly understood that the same is by way of illustrated and example only and is not to be taken by way limitation, the scope of the present invention being interpreted by terms of the appended claims.

EXPLANATION OF REFERENTIAL NUMERALS

1 Si (silicon) substrate or SOI (Silicon On Insulator) substrate
2 SiC layer
3, 5, 5a, 5b, 5c AlN (aluminum nitride) layer
4, 4a, 4b, 4c, 7 GaN (gallium nitride) layer
6, 6a, 6b, 6c composite layer
8 AlGaN (aluminum nitride gallium) layer
11 source electrode
12 drain electrode
13 gate electrode
21 Si substrate
22 $SiO_2$ (oxidized silicon) layer
23 Si layer
31 the first layer
32 the second layer
33 the third layer

What is claimed is:

1. A composite semiconductor substrate comprising:
an Si substrate or an SOI (Silicon On Insulator) substrate,
an SiC layer formed on a surface of the substrate,
an $Al_aIn_bGa_{1-a-b}N$ layer ($0<a \leq 1$, $0 \leq b<1$, $0 \leq 1-a-b<1$, $a>b$, $a>1-a-b$) formed on a surface of the SiC layer,
a composite layer formed on a surface of the $Al_aIn_bGa_{1-a-b}N$ layer, and
an $Al_cIn_dGa_{1-c-d}N$ layer ($0 \leq c \leq 0.3$, $0 \leq d \leq 0.4$, $c<a$, $1-a-b<1-c-d$) formed on a surface of the composite layer, wherein
the composite layer includes an $Al_vIn_wGa_{1-v-w}N$ layer ($0 \leq v \leq 0.3$, $0 \leq w \leq 0.4$, $v<a$, $1-a-b<1-y$ $v-w$) and an $Al_xIn_yGa_{1-x-y}N$ layer ($v<x \leq 1$, $0 \leq y<1$, $0 \leq 1-x-y<1$, $1-x-y<1-v-w$, $c<x$, $1-x-y<1-c-d$, $x>y$, $x>1-x-y$) formed on a surface of the $Al_vIn_wGa_{1-v-w}N$ layer, and
an average density of C and Fe in the $Al_vIn_wGa_{1-v-w}N$ layer is higher than an average density of C and Fe in the $Al_xIn_yGa_{1-x-y}N$ layer in at least one the composite layer,
wherein a thickness of the $Al_vIn_wGa_{1-v-w}N$ layer is more than or equal to 50 nm and equal to or less than 5 μm, a thickness of the $Al_xIn_yGa_{1-x-y}N$ layer is more than or equal to 10 nm and equal to or less than 500 nm, and a number of the composite layers is more than or equal to 1 and equal to or less than 9.

2. The composite semiconductor substrate according to claim 1, wherein
the number of the composite layers is plural, and
the $Al_vIn_wGa_{1-v-w}N$ layer in at least one of the plurality of the composite layers includes C.

3. The composite semiconductor substrate according to claim 2, wherein
average densities of C and Fe in the $Al_vIn_wGa_{1-v-w}N$ layers in the plurality of composite layers decrease from the $Al_vIn_wGa_{1-v-w}N$ layer nearest the SIC layer toward the $Al_vIn_wGa_{1-v-w}N$ layer farthest from the SiC layer.

4. The composite semiconductor substrate according to claim 2, wherein
the number of the composite layers is more than or equal to 3 and equal to or less than 6.

5. The composite semiconductor substrate according to claim 2, wherein
a compositional ratio of each of Al, In, and Ga of one $Al_vIn_wGa_{1-v-w}N$ layer in the plurality of composite layers and a compositional ratio of each of Al, In, and Ga of another $Al_vIn_wGa_{1-v-w}N$ layer in the plurality of composite layers are different from each other, and
a compositional ratio of each of Al, In, and Ga of one $Al_xIn_yGa_{1-x-y}N$ layer in the plurality of composite layers and a compositional ratio of each of Al, In, and Ga of another $Al_xIn_yGa_{1-x-y}N$ layer in the plurality of composite layers are different from each other.

6. The composite semiconductor substrate according to claim 1, wherein
an average density of C and Fe in the $Al_vIn_wGa_{1-v-w}N$ layer of at least one of the composite layers is more than or equal to $1*10^{18}$ atoms/cm$^3$ and equal to or less than $1*10^{20}$ atoms/cm$^3$.

7. The composite semiconductor substrate according to claim 6, wherein
the average density of C and Fe in the $Al_vIn_wGa_{1-v-w}N$ layer of at least one of the composite layers is more than or equal to $3*10^{18}$ atoms/cm$^3$ and equal to or less than $1*10^{19}$ atoms/cm$^3$.

8. The composite semiconductor substrate according to claim 1, wherein
a density of C and Fe in an inner part of the $Al_vIn_wGa_{1-v-w}N$ layer in at least one of the composite layers changes from a side close to the SIC layer toward a side away from the SIC layer.

9. The composite semiconductor substrate according to claim 1, wherein
the $Al_vIn_wGa_{1-v-w}N$ layer in at least one of the composite layers includes a first layer, a second layer formed on a surface of the first layer, and a third layer formed on a surface of the second layer, and
an average density of C and Fe in the second layer is higher than an average density of C and Fe in the first layer and an average density of C and Fe in the third layer.

10. The composite semiconductor substrate according to claim 1, wherein
the $Al_vIn_wGa_{1-v-w}N$ layer is an $Al_vGa_{1-v}N$ layer ($0 \leq v \leq 0.3$, $v<a, 1-a-b<1-v$), and
the $Al_xIn_yGa_{1-x-y}N$ layer is an $Al_xGa_{1-x}N$ layer ($v<x\leq1$, $0<x\leq1, 1-x<1-v, c<x, 1-x<1-c-d, x<1-x$).

11. The composite semiconductor substrate according to claim 10, wherein
the $Al_vIn_wGa_{1-v-w}N$ layer is a GaN layer,
the $Al_xIn_yGa_{1-x-y}N$ layer is an AlN layer.

12. The composite semiconductor substrate according to claim 1, further comprising:
a first and a second electrodes formed at the surface side of the $Al_cIn_dGa_{1-c-d}N$ layer, wherein
magnitude of electrical current which flows between the first electrode and the second electrode depends on electrical voltage between the first electrode and the second electrode.

* * * * *

UNITED STATES PATENT AND TRADEMARK OFFICE
CERTIFICATE OF CORRECTION

PATENT NO. : 10,186,421 B2  
APPLICATION NO. : 15/556531  
DATED : January 22, 2019  
INVENTOR(S) : Akira Fukazawa, Mitsuhisa Narukawa and Keisuke Kawamura Page 1 of 1

It is certified that error appears in the above-identified patent and that said Letters Patent is hereby corrected as shown below:

In the Claims

Column 12, Lines 38-44 should read as follows:
3. The composite semiconductor substrate according to claim 2, wherein
    average densities of C and Fe in the $Al_vIn_wGa_{1-v-w}N$ layers in the plurality of composite layers decrease from the $Al_vIn_wGa_{1-v-w}N$ layer nearest the SiC layer toward the $Al_vIn_wGa_{1-v-w}N$ layer farthest from the SiC layer.

Column 13, Lines 7-11 should read as follows:
8. The composite semiconductor substrate according to claim 1, wherein
    a density of C and Fe in an inner part of the $Al_vIn_wGa_{1-v-w}N$ layer in at least one of the composite layers changes from a side close to the SiC layer toward a side away from the SiC layer.

Column 14, Lines 1-6 should read as follows:
10. The composite semiconductor substrate according to claim 1, wherein
    the $Al_vIn_wGa_{1-v-w}N$ layer is an $Al_vGa_{1-v}N$ layer ($0 \leq v \leq 0.3$, $v<a$, $1-a-b<1-v$), and
    the $Al_xIn_yGa_{1-x-y}N$ layer is an $Al_xGa_{1-x}N$ layer ($v<x \leq 1$, $0<x \leq 1$, $1-x<1-v$, $c<x$, $1-x<1-c-d$, $x>1-x$).

<div style="text-align: right;">
Signed and Sealed this  
Twenty-ninth Day of October, 2019
</div>

<div style="text-align: right;">
Andrei Iancu  
*Director of the United States Patent and Trademark Office*
</div>